(12) United States Patent
Michaluk et al.

(10) Patent No.: US 7,601,296 B2
(45) Date of Patent: Oct. 13, 2009

(54) POWDER METALLURGY SPUTTERING TARGETS AND METHODS OF PRODUCING SAME

(75) Inventors: Christopher A. Michaluk, Gilbertsville, PA (US); Shi Yuan, West Chester, PA (US); James Maguire, Norristown, PA (US)

(73) Assignee: Cabot Corporation, Boston, MA (US)

( * ) Notice: Subject to any disclaimer, the term of this patent is extended or adjusted under 35 U.S.C. 154(b) by 444 days.

(21) Appl. No.: 11/431,259

(22) Filed: May 10, 2006

(65) Prior Publication Data

US 2006/0201583 A1 Sep. 14, 2006

Related U.S. Application Data

(62) Division of application No. 10/752,270, filed on Jan. 6, 2004, now Pat. No. 7,067,197.

(60) Provisional application No. 60/438,465, filed on Jan. 7, 2003.

(51) Int. Cl.
*B22F 1/00* (2006.01)

(52) U.S. Cl. .............................. 419/30; 419/48; 419/49; 419/67; 148/237; 148/238; 75/244; 421/551; 421/559

(58) Field of Classification Search .................. 419/30
See application file for complete search history.

(56) References Cited

U.S. PATENT DOCUMENTS

| | | | |
|---|---|---|---|
| 5,242,481 A | 9/1993 | Kumar | 75/364 |
| 5,415,829 A | 5/1995 | Ohhashi et al. | 419/23 |
| 5,489,367 A | 2/1996 | Kubota et al. | 204/192.15 |
| 5,863,398 A | 1/1999 | Kardokus et al. | 204/298.13 |
| 6,217,969 B1 | 4/2001 | Takahashi et al. | 428/64.1 |
| 6,261,337 B1 | 7/2001 | Kumar | 75/255 |
| 6,342,133 B2 | 1/2002 | D'Couto et al. | 204/192.17 |
| 6,348,113 B1 | 2/2002 | Michaluk et al. | 148/668 |
| 6,521,173 B2 | 2/2003 | Kumar et al. | 419/23 |
| 6,589,311 B1 | 7/2003 | Han et al. | 75/245 |
| 6,676,728 B2 | 1/2004 | Han et al. | 75/346 |
| 6,887,356 B2 | 5/2005 | Ford et al. | 204/298.12 |
| 2002/0072475 A1 | 6/2002 | Michaluk et al. | 505/100 |

FOREIGN PATENT DOCUMENTS

| | | |
|---|---|---|
| EP | 0 665 302 A2 | 1/1995 |
| JP | 2000/323432 | 11/2000 |
| WO | WO 00/31310 | 6/2000 |
| WO | WO 01/96620 | 12/2001 |

OTHER PUBLICATIONS

International Search Report for PCT/US2004/000270 dated Nov. 12, 2004.

*Primary Examiner*—Roy King
*Assistant Examiner*—Christopher Kessler

(57) ABSTRACT

A method of forming a sputtering target and other metal articles having controlled oxygen and nitrogen content levels and the articles so formed are described. The method includes surface-nitriding a deoxidized metal powder and further includes consolidating the powder by a powder metallurgy technique. Preferred metal powders include, but are not limited to, valve metals, including tantalum, niobium, and alloys thereof.

17 Claims, No Drawings

POWDER METALLURGY SPUTTERING TARGETS AND METHODS OF PRODUCING SAME

This application is a divisional of U.S. patent application Ser. No. 10/752,270, filed Jan. 6, 2004 (now U.S. Pat. No. 7,067,197), which in turn claims the benefit of U.S. Provisional Patent Application No. 60/438,465, filed Jan. 7, 2003, and incorporated in their entirety by reference herein.

BACKGROUND OF THE INVENTION

The present invention relates to sputtering targets and other metal articles as well as methods of making the same. More particularly, the present invention relates to methods for forming powder metallurgy sputtering targets and other metallurgical articles made from valve metal materials.

Sputtering targets are used for many purposes, including producing thin films of metals or compounds. In a sputtering process, a source material is bombarded with plasma ions that dislodge or eject atoms from the surface of a sputter target. The ejected atoms are deposited atop a substrate to form a film coating that is typically several atomic layers thick.

Sputtering targets can be made from valve metal materials. Valve metals generally include tantalum, niobium, and alloys thereof, and also may include metals of Groups IVB, VB, and VIB and alloys thereof. Valve metals are described, for example, by Diggle, in "Oxides and Oxide Films", Vol. 1, pages 94-95, 1972, Marcel Dekker, Inc., New York, incorporated in its entirety by reference herein.

Semiconductor technology is forecast to be the largest market for tantalum sputtering targets. Semiconductors are the building blocks of a class of microelectronic devices that include microprocessors found in mainframe computers, work stations, and PCs, digital signal processors for cell phones and telecommunication equipment, and application-specific integrated circuits used in digital organizers, cameras, and electronic appliances.

Driven by continuous reductions in costs, device size, and improved performance, copper is replacing aluminum for use as interconnects in next generation semiconductors. To prevent the copper of the interconnects from migrating through the semiconductor device and "poisoning" the transistors and other electronics, a diffusion barrier is commonly interposed between the interconnects and the device. Tantalum (Ta) and tantalum nitride (TaN), which is typically produced by the reactive sputtering of a tantalum target in the presence of nitrogen, are commonly-used barrier materials for copper interconnects. By way of example, microprocessors operating at clock speeds in excess of 1000 MHz, such as AMD's Althon and Intel's Pentium 4, as well as IBM's I STAR and P-750 processors found in modern mainframe systems, each use copper interconnects along with a tantalum diffusion barrier layer.

Films having uniform chemistry and thickness are preferred for diffusion barrier applications. To obtain uniform chemistry and thickness, it is preferable to sputter a target having certain desirable properties, including, high purity, a fine grain size, and a homogeneous texture void of strong (001) texture bands. Commonly, tantalum materials produced from ingot metallurgy (ingot-met) techniques as described, for example, in U.S. Pat. No. 6,348,113 (Michaluk et al.), which is incorporated in its entirety by reference herein, are specified for sputtering applications. Ingot-met tantalum material may produce the purity levels and maximum grain size desirable for diffusion barrier applications. However, by nature, it is difficult to refine and control the grain size and texture homogeneity in high purity, unalloyed and undoped metallic materials. As such, the minimum average recrystallized grain size attainable in wrought high purity ingot-met tantalum targets may be about 10 microns. In addition, ingot-met tantalum targets may also exhibit textural banding and consequently may produce sputtered films of highly variable thicknesses.

Powder metallurgy (powder-met) techniques offer an alternative method of manufacturing tantalum material and tantalum sputtering targets. Proper processing can produce powder-met tantalum sputtering targets having a finer grain size than that attainable in ingot-met tantalum targets. The higher amounts of interstitial impurities inherent in the powder-met materials increases the work hardening rate, and hence the rate of new dislocation line length generation and subsequent recrystallization response during annealing, by behaving like a dispersion of fine particles within the matrix. For this reason, a smaller, more homogeneous grain structure is achieved in commercially produced powder-met tantalum thin gauge strip and wire than that which is attainable in ingot-met tantalum products of similar gauge.

The (isostatic) consolidation of metal powders is a viable and established means of producing certain metal articles having a random and homogeneous texture. The combination of fine grain size having a random distribution of crystal orientations promote the uniformity of work (e.g., homogeneous strain hardending of all grains) during subsequent deformation processing of powder-met tantalum sputtering targets, thus avoiding the formation of sharp texture bands in powder-met sputtering targets. The powder-met tantalum sputtering targets are expected to deposit films having exceptional thickness uniformity.

Commercially available tantalum powder, however, contains unacceptably high levels of oxygen for use in diffusion barrier applications. Under ambient conditions, tantalum metal has a passive coating, e.g., such as approximately 1 nm or less to 3 nm or more thick oxide film that is comprised of tantalum oxide and absorbed oxygen gas (L. A. Rozenberg and S. V. Shtel'makl, "State of Oxygen in Tantalum Powders," *Ivestiya Akademii Naut SSSR. Metally*, (4) 1985, pp. 163, incorporated in its entirety by reference herein). Commercial tantalum powder that is deoxidized and then exposed to oxygen to reform a passive oxide coating will still typically contain more than 100 ppm oxygen. Preferably, the oxygen content of tantalum sputtering targets is limited to 100 ppm or less. Excessive oxygen in the sputtering target can lead to the creation of tantalum-oxide within the deposited tantalum nitride barrier layer and a subsequent undesirable increase in the RC delay in the interconnect line.

Accordingly, methods for forming low-oxygen metal powder, and sputtering targets or other metal articles produced from the metal powder, are needed for depositing high-integrity films via reactive sputtering.

SUMMARY OF THE PRESENT INVENTION

It is therefore a feature of the present invention to provide a method to form a powder metallurgy sputtering target and other metal articles having low oxygen content.

Another feature of the present invention is to provide a method of deoxidizing tantalum and surface-nitriding a metal powder by passivating the deoxidized powder in the presence of nitrogen.

Another feature of the present invention is forming metallurgical articles from surface-nitrided metal powders having low oxygen content.

Another feature of the present invention is to provide a sputtering target assembly having a consolidated surface-nitrided metal powder sputtering target and a backing plate.

Another feature of the present invention is to provide a sputtering target having an average grain size of about 100 microns or less.

Another feature of the present invention is to provide a sputtering target having a random texture.

Another feature of the present invention is to perform thermomechanical processing on a metal article formed from metal powder to produce a sputtering target having an average grain size of about 100 microns or less and a texture that lies on or near the (111)-(100) symmetry line of the Maxwell standard orientation triangle.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a method of forming a sputtering target or other metal article. The method includes surface-nitriding a deoxidized metal powder. The method can involve consolidating the surface-nitrided metal powder by a powder metallurgy technique. The metal powder can optionally be consolidated into a sputtering target and further machined or processed by conventional processing techniques.

The present invention further relates to a formed metallurgical article having an oxygen content of about 100 ppm or less and a nitrogen content of at least about 10 ppm.

The present invention also relates to providing a surface-nitrided metal powder having a tantalum nitride shell.

It is to be understood that both the foregoing general description and the following detailed description are exemplary and explanatory only and are intended to provide a further explanation of the present invention, as claimed.

DETAILED DESCRIPTION OF THE PRESENT INVENTION

The present invention is directed to providing a metal powder, preferably a valve metal powder, having an oxygen content of 300 parts per million (ppm) or less, and more preferably 100 ppm or less, and a nitrogen content of at least 10 ppm, and more preferably at least 40 ppm. Preferably, the valve metal powder is tantalum, niobium, or alloys thereof. The present invention further relates to a method for forming sputtering targets and other metal articles from a surface-nitrided, low-oxygen metal powder. Other metal articles include, but are not limited to, capacitors, anodes, capacitor cans, and wrought products. The present invention further relates to the metal films produced by sputtering targets and other deposition source materials manufactured from surface-nitrided, low oxygen metal powders.

In more detail, the present invention relates to valve metal powders having nitrogen contained therein. The amount of nitrogen present is generally greater than nitrogen amounts found in valve metal powders as impurities. The majority of the nitrogen present in the valve metal powders of the present invention is a result of intentional conditions which lead to increased levels of nitrogen on the surface of the valve metal powders (i.e., surface-nitriding of the valve metal). The nitrogen present in the valve metal can be accomplished in any manner. For instance, the nitrogen can be introduced (e.g., doped) into the valve metal during any processing stage of the valve metal, such as during one or more of the following stages: deoxidation; hydriding of the valve metal; delubing of the valve metal; any sintering of the valve metal (e.g., such as sintering of the valve metal capacitor anode); any thermal processing of the valve metal; any heat treatment stage; or anytime before or after any one or more of these processing steps or stages.

Any means can be used to surface-nitride the valve metal material, such as, but not limited to, exposure to nitrogen containing environments (e.g., $N_2$ and $NH_3$ gases) or nitrogen-containing materials, preferably during a thermal cycling to defuse the nitrogen into the material (e.g., preparing a solid-solution of nitrogen by reaction of nitrogen containing materials by diffusion from direct physical contact or gas adsorption and/or absorption).

The valve metal that can be used in this embodiment is any valve metal powder, such as flaked, angular, nodular, and mixtures or variations thereof. With respect to the flaked valve metal powder, the valve metal powder can be characterized as flat, plate shaped, and/or platelet. Any of the embodiments set forth and/or described below can also be subjected to conditions that will lead to valve metal powders having the described nitrogen amounts. Examples of valve metal powders include those having mesh sizes of from between about 40 to about 400 mesh or less, and preferably, of from between about 40 to about 100 mesh. The BET surface area of the valve metal powder can be from about 0.1 $m^2/g$ to about 10 $m^2/g$ or greater. The BET can be less than about 10 $m^2/g$, or can be less than about 1 $m^2/g$, or can be less than about 0.1 $m^2/g$.

One method to deoxidize valve metal powders, such as tantalum powder, is to mix alkaline earth metals, magnesium, aluminum, yttrium, carbon, or tantalum carbide with the tantalum powder. The alkaline earth metals, aluminum, and yttrium may form refractory oxides that are preferably removed, such as by acid leaching, before the material can be used to produce capacitors. Typically, the post-deoxidation acid leaching is performed using a strong mineral acid solution including, for example, hydrofluoric acid, at elevated temperatures of up to about 100° C. or more to dissolve the refractory oxide contaminants. Also, cold acid leaching can be used, preferably after deox to lower oxygen levels in Ta powder or other metal powders. Other methods have been proposed, including using a thiocyanate treatment, or a reducing atmosphere throughout the tantalum powder processing, to prevent oxidation and provide low oxygen content.

Other processes for controlling the oxygen content of valve metal materials, such as tantalum, niobium, and their alloys, include the use of getter materials. For example, U.S. Pat. No. 4,722,756 (Hard), which is incorporated in its entirety by reference herein, describes heating the materials in an atmosphere containing hydrogen gas in the presence of a metal, such as zirconium or titanium that is more oxygen active than tantalum or niobium. Another process for controlling the oxygen content of valve metal materials is disclosed in U.S. Pat. No. 4,964,906 (Fife), which is incorporated in its entirety by reference herein. The process involves heating a tantalum material or other metal in a hydrogen-containing atmosphere in the presence of a getter material having an oxygen concentration lower than the valve metal material.

The method of the present invention includes surface-nitriding deoxidized metal powder to form a metal powder having an oxygen content, preferably, of about 300 ppm or less and having a nitrogen content, preferably, of at least about 10 ppm. The surface-nitrided metal powder can be consolidated by a powder metallurgy technique to form a sputtering target or other metallurgical article. The method can optionally include further processing the sputtering target or other metallurgical article using conventional thermomechanical processing such as forging and rolling, and finishing techniques such as machining, polishing, and surface conditioning.

In one embodiment of the present invention, a deoxidized metal powder and a nitrogen gas (e.g., $N_2$ or $NH_3$) or other nitrogen source are contacted to form a surface-nitrided metal powder having an oxygen content from about 300 to about 100 ppm or less and having a nitrogen content of at least from about 10 to about 40 ppm or higher. Contacting can be by any conventional method, including doping the metal powder with the nitrogen gas, introducing the gas to the metal powder, reacting the gas and the metal powder, absorption of the gas by the metal powder, or one of the methods described earlier, or any combination thereof. Contacting the metal powder and the nitrogen gas can be under vacuum, under a pressure (positive, negative, or neutral) of an inert gas, or both. Contacting can be in any suitable container, for example, in a retort, furnace, or vacuum chamber. The container containing the metal powder and the nitrogen gas can be backfilled with an inert gas. Any inert gas can be used, such as argon. The container can be vacuumed to a desired pressure and the container backfilled with nitrogen. The amount of nitrogen used to backfill can be calculated based on the amount of the metal powder and a desired nitrogen concentration of the metal powder formed. The temperature in the container can be increased to promote contacting or absorption of the metal powder and the nitrogen.

The metal powder can be nitrogen-passivated or surface-nitrided in the process described above. Surface-nitriding the metal powder can have the effect of reducing the pyrophorisity of the metal powder. The process of surface-nitriding the metal powder can produce a metal powder having a nitride shell. For example, surface-nitrided tantalum and niobium powders can have tantalum nitride and niobium nitride shells, respectively. Surface-nitriding the metal powder according to the present invention may have the effect of inhibiting the re-absorption of oxygen by the deoxidized metal powder. The surface-nitrided metal powder can have an oxygen content of about 300 ppm or less, and preferably, from about 100 ppm to about 5 ppm or about 1 ppm or less. The surface-nitrided metal powder can have a nitrogen content of at least about 10 ppm, and preferably, at least about 40 ppm, such as from about 10 ppm to about 10,000 ppm or more (e.g. from about 10 ppm to about 300,000 ppm). Other ranges include less than about 100 ppm, from about 100 ppm to about 500 ppm, from about 500 ppm to about 1000 ppm, and greater than about 1000 ppm. The surface-nitrided metal powder preferably has a particle diameter of about 200 microns or less to avoid arcing in the sputtering process, and preferably 100 microns or less to facilitate consolidation and subsequent thermomechanical processing.

According to the present invention, a formed metallurgical article including a sputtering target, having an oxygen content below about 100 ppm and a nitrogen content of at least about 40 ppm, can be produced from metal powder, preferably tantalum, niobium or alloy, having an oxygen content below about 100 ppm and a nitrogen content of at least about 40 ppm, by any powder metallurgy technique, used, for example, for tantalum, niobium and their alloys. In one embodiment, the metal is not exposed to a temperature greater than about $0.7\ T_H$. For purposes of the present invention, the homogolous temperature is the ratio of the absolute temperature of a material to its absolute melting temperature, and is expressed as, $T_H = T/T_m$. Exemplary of the powder metallurgy techniques used for forming the metal products are the following, in which the steps are listed in order of performance. Any of the techniques can be used in the present invention, and preferably, any sintering, heating, or other handling, of the metal does not expose the metal to a temperature greater than $0.7\ T_H$:

1. Cold Isostatic Pressing, Sintering, Encapsulating, Hot Isostatic Pressing and Thermo-Mechanical Processing;
2. Cold Isostatic Pressing, Sintering, Hot Isostatic Pressing and Thermo-Mechanical Processing;
3. Cold Isostatic Pressing, Encapsulating, Hot Isostatic Pressing and Thermo-Mechanical Processing;
4. Cold Isostatic Pressing, Encapsulating and Hot Isostatic Pressing;
5. Encapsulating and Hot Isostatic Pressing;
6. Cold Isostatic Pressing, Sintering, Encapsulating, Extruding and Thermo-Mechanical Processing;
7. Cold Isostatic Pressing, Sintering, Extruding, and Thermo-Mechanical Processing;
8. Cold Isostatic Pressing, Sintering, and Extruding;
9. Cold Isostatic Pressing, Encapsulating, Extruding and Thermo-Mechanical Processing;
10. Cold Isostatic Pressing, Encapsulating and Extruding;
11. Encapsulating and Extruding;
12. Mechanical Pressing, Sintering and Extruding;
13. Cold Isostatic Pressing, Sintering, Encapsulating, Forging and Thermo-Mechanical Processing.
14. Cold Isostatic Pressing, Encapsulating, Forging and Thermo-Mechanical Processing;
15. Cold Isostatic Pressing, Encapsulating and Forging;
16. Cold Isostatic Pressing, Sintering, and Forging;
17. Cold Isostatic Pressing, Sintering and Rolling;
18. Encapsulating and Forging;
19. Encapsulating and Rolling;
20. Cold Isostatic Pressing, Sintering and Thermo-Mechanical Processing;
21. Spray Depositing;
22. Mechanical Pressing and Sintering; and
23. Mechanical Pressing, Sintering, Repressing and Resintering.

Other combinations of consolidating, heating and deforming may also be used. Examples of powder-met techniques are described, for example, in U.S. Pat. No. 5,580,516 (Kumar), incorporated in its entirety by reference herein.

Other processes that expose the metal powder to processing temperatures above $0.7\ T_H$ can be utilized to fabricate or consolidate the metal powder, or both. For example, the metal powder can be produced by first casting a metal ingot, hydriding the cast ingot, crushing the hydrided metal ingot, then optionally removing the hydrogen from the resultant metal powder. In another example, the metal is melted then atomized by processes including, but not limited to, gas atomization (including nitrogen gas atomization), water atomization, and rotating electrode powder processes. The powders can be subsequently deoxidized then surface-nitrided using a process such as that described below. The surface-nitrided metal powder can then be consolidated by pressing and sintering in vacuum at a temperature above $0.7\ T_H$ to produce a high-density metal compact.

In one embodiment of the present invention, a starting metal material, preferably a valve metal including, tantalum, niobium, or alloy powder, such as one produced by a sodium reduction process, is placed into a container such as a vacuum chamber, with a getter material. An example of a sodium reduction process for producing tantalum powder is described, for example, in U.S. Pat. No. 6,348,113. The getter material can be any material having a higher affinity for oxygen than the powder, i.e., an oxygen getter, and is preferably an oxygen active metal. One metal that is more oxygen active than the powder, is magnesium. Preferably, the starting metal material or compound has an oxygen content less than about 1000 ppm.

A vacuum can be drawn in the chamber. The chamber can be backfilled with an inert gas, preferably argon. The chamber is heated to a desired temperature. For instance, the chamber can be heated to a temperature below the melting temperature and preferably to a homologous temperature ($T_H$) of about 0.7 $T_H$, or less, for example, in the range of about 550 to about 1150° C. of the metal powder. The heating is continued for a time sufficient to allow oxygen to diffuse out of the metal powder, for example, preferably about 60 minutes. A vacuum can again be drawn in the chamber and the chamber backfilled with an inert gas, such as argon. The chamber can then be cooled or allowed to cool to a desired temperature, about 300° C., for instance. When the temperature in the chamber is at about the desired temperature, a vacuum can be drawn in the chamber to a desired pressure, for example, about 50 torr.

The metal powder is then contacted with nitrogen. The chamber can be backfilled with nitrogen. The amount of nitrogen to be used is determined based upon the amount of metal powder in the chamber and the desired nitrogen concentration of the formed metal powder. The chamber can be heated to a desired temperature and/or at a desired rate, e.g., preferably about 1° C. per minute, causing the nitrogen to react with or be absorbed by the metal powder. The chamber can be backfilled with an inert gas, such as argon. The residual getter material, containing the oxygen, is removed from the metal powder, for example by selective chemical leaching or dissolution of the powder. According to one embodiment, the surface-nitrided metal powder produced by the method described above, can be consolidated to form a metal or metallurgical article. Consolidating can be by a powder-met technique, for example, as described above.

As described above, in the process for producing formed powder metal articles of tantalum, niobium and their alloys, a tantalum, niobium, or alloy of tantalum or niobium, powder is, if needed, deoxidized, to an oxygen content of less than about 300 ppm, and preferably of less than about 100 ppm, preferably without exposing the metal powder to a temperature greater than about 0.7 $T_H$, and the powder is surface-nitrided, to have a nitrogen content of at least about 10 ppm, and preferably, of at least about 40 ppm, and then is consolidated to form a tantalum, niobium, or alloy metallurgical article, having an oxygen content below about 300 ppm, preferably below about 100 ppm, and having a nitrogen content of at least about 10 ppm, and preferably of at least about 40 ppm.

The metallurgical article described above is preferably a sputtering target assembly including two components, namely, a backing plate and a sputter target. The sputter target and the backing plate can be any suitable target grade and backing plate grade materials. The powder used to make the metallurgical article such as the sputtering target as well as the resulting metallurgical article, such as the sputter target can have any purity with respect to the metal. For instance, the purity can be 99% or greater such as from about 99.5% or greater and more preferably 99.95% or greater and even more preferably 99.99% or greater. The metallurgical article such as a sputter target can have any suitable grain size and/or texture. For instance, the article can have an average grain size of about 300 microns or less and more preferably an average grain size of 100 microns or less and even more preferably a grain size of about 50 microns or less and most preferably an average grain size of about 10 microns. Suitable ranges include from about 10 microns to about 100 microns in average grain size.

In addition, the texture can be random, such that the grains comprising the metal article exhibit minimal or no preferred crystallographic orientation. Or, the metal article can be thermomechanically processed to produce a preferred orientation that lies along or near the (111)-(100) symmetry line of the Maxwell standard orientation triangle. Examples of preferred orientations include a primary (111) texture or a primary (100) texture that can be on the surface or throughout the entire thickness of the metal article. Preferably, the texture is uniform. Also, the article can have a mixed (111):(110) texture throughout the surface or throughout the entire thickness of the metal article. In addition, the metal article can be substantially void of textural banding, such as substantially void of (100) textural banding. In addition, the metal article can be drawn, stretched, or extruded to produce a (110) texture. The (110) crystal planes in Body Center Cubic (BCC) metals have the highest areal density of atoms, and sputtering targets having a (110) have the highest sputtering yield compared to sputtering targets having other primary orientations.

With respect to the target materials to be used in the method of the present invention, examples include, but are not limited to, tantalum, niobium, cobalt, titanium, copper, aluminum, and alloys thereof, for instance, the alloys described above. Examples of the backing plate include, but are not limited to, copper, or a copper alloy, tantalum, niobium, cobalt, titanium, aluminum, and alloys thereof, such as TaW, NbW, TaZr, NbZr, TaNb, NbTa, TaTi, NbTi, TaMo, NbMo, and the like. No limitation exists as to the type of materials used in the sputtering target and the backing plate. The thicknesses of the backing and the target material can be any suitable thickness used for forming sputtering targets. Alternatively, the backing plate and the target material or other metal plate to be bonded onto the backing plate can be any suitable thickness for the desired application. Examples of suitable thicknesses of the backing plate and of the target material include, but are not limited to, a backing plate with a thickness of from about 0.25 or less to about 2 inches or more in thickness and targets with a thickness ranging from about 0.06 inches to about 1 inch or greater. The sputtering target can also have an interlayer as is conventional in the industry. Furthermore, the sputtering target can be a hollow cathode magnetron sputtering target and can be other forms of sputtering targets. Except as mentioned above, the purity, texture, and/or grain size and other properties, including size and the like are not critical to the present invention. The present invention provides a method of making a powder-met sputtering target assembly with any type of sputter target and backing plate.

In one embodiment of the present invention, consolidating comprises compressing said surface-nitrided metal powder to about 80 to about 100% of theoretical density with compressive forces of from about 30,000 to about 90,000 psi. In another embodiment, the sputtering target of the present invention has a yield strength from about 18,000 to about 40,000 psi and an elongation to failure of greater than 20% when tested in tension at a strain rate of 0.005 inches/inch per minute for a standard ASTM E8 subscale tensile tested in accordance to ASTM E8.

As noted, TaN thin films used as a diffusion barrier for copper interconnects in high-speed microprocessors, are commonly deposited by reactive sputtering of tantalum in the presence of nitrogen. The sputtering target according to the present invention is particularly advantageous for use in nitride film sputter applications, given the nitrogen content level attained in the sputtering target formed. Because much of the nitrogen present in metal powder is removed by evaporation at temperatures reached in metal ingot formation, the nitrogen content in ingot-met sputtering targets is substantially less than that in the sputtering target formed according to the present invention.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method for forming a powder metallurgy article, comprising:
    surface-nitriding a deoxidized metal powder to form a surface-nitrided metal powder having an oxygen content of about 300 ppm or less and having a nitrogen content of at least about 10 ppm;
    consolidating said surface-nitrided metal powder by a powder metallurgy technique to form a metallurgical article; and
    wherein said formed metallurgical article comprises a sputtering target.

2. The method of claim 1, wherein said deoxidized metal powder comprises a valve metal.

3. The method of claim 1, wherein said deoxidized metal powder comprises tantalum.

4. The method of claim 3, wherein said surface-nitrided metal powder is formed having a tantalum nitride shell.

5. The method of claim 1, wherein said deoxidized metal powder comprises niobium.

6. The method of claim 5, wherein said surface-nitrided metal powder is formed having a niobium nitride shell.

7. The method of claim 1, wherein said surface-nitrided metal powder has an oxygen content of 100 ppm or less and has a nitrogen content of at least about 40 ppm.

8. The method of claim 1, wherein said deoxidized metal powder has a mesh size of from about 40 to about 400 mesh.

9. The method of claim 1, wherein said surface-nitrided metal powder has a nitrogen content from about 100 ppm to about 1000 ppm.

10. The method of claim 1, wherein said consolidating is at a temperature not exceeding 0.7 $T_H$ of said deoxidized metal powder.

11. The method of claim 1, wherein said consolidating comprises compressing said surface-nitrided metal powder to from about 80 to about 100% of theoretical density with compressive forces of from about 30,000 to about 90,000 psi.

12. The method of claim 1, wherein said powder metallurgy technique comprises hot isostatic pressing.

13. The method of claim 1, wherein said powder metallurgy technique comprises extrusion.

14. The method of claim 1, wherein said surface-nitriding comprises contacting with a nitrogen gas.

15. The method of claim 1, wherein said formed metallurgical article has an oxygen content of about 300 ppm or less and has a nitrogen content of at least about 10 ppm.

16. The method of claim 1, wherein said formed metallurgical article has an oxygen content from about 1 ppm to about 100 ppm.

17. The method of claim 1, wherein said formed metallurgical article has a nitrogen content from about 40 ppm to about 10,000 ppm.

* * * * *

UNITED STATES PATENT AND TRADEMARK OFFICE
CERTIFICATE OF CORRECTION

PATENT NO.       : 7,601,296 B2  
APPLICATION NO. : 11/431259  
DATED            : October 13, 2009  
INVENTOR(S)      : Michaluk et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 600 days.

Signed and Sealed this

Fifth Day of October, 2010

David J. Kappos  
*Director of the United States Patent and Trademark Office*